United States Patent
Yonesi et al.

(10) Patent No.: US 7,580,469 B2
(45) Date of Patent: Aug. 25, 2009

(54) COMMUNICATION LINK CONTROL USING ITERATIVE CODE METRICS

(75) Inventors: Ronen Yonesi, Netanya (IL); Jonathan Friedmann, Tel Aviv (IL); Ahikam Aharony, Tel Mond (IL)

(73) Assignee: Provigent Ltd, Herzliya (IL)

( * ) Notice: Subject to any disclaimer, the term of this patent is extended or adjusted under 35 U.S.C. 154(b) by 256 days.

(21) Appl. No.: 11/483,078

(22) Filed: Jul. 6, 2006

(65) Prior Publication Data

US 2008/0008257 A1 Jan. 10, 2008

(51) Int. Cl.
H04L 5/12 (2006.01)

(52) U.S. Cl. .................................... 375/262
(58) Field of Classification Search ................. 375/262
See application file for complete search history.

(56) References Cited

U.S. PATENT DOCUMENTS

| | | | |
|---|---|---|---|
| 5,311,546 A | 5/1994 | Paik et al. | |
| 5,742,646 A * | 4/1998 | Woolley et al. | 375/349 |
| 6,252,912 B1 | 6/2001 | Salinger | |
| 2002/0181490 A1 * | 12/2002 | Frannhagen et al. | 370/442 |
| 2005/0010853 A1 | 1/2005 | Duvant et al. | |
| 2005/0063496 A1 * | 3/2005 | Guillouard et al. | 375/346 |
| 2005/0190868 A1 | 9/2005 | Khandekar et al. | |
| 2006/0013181 A1 * | 1/2006 | Stolpman et al. | 370/342 |
| 2007/0116143 A1 * | 5/2007 | Bjerke et al. | 375/262 |
| 2008/0043829 A1 | 2/2008 | Shiue et al. | |

OTHER PUBLICATIONS

Hassan, "LPDC encoded pilots for iterative receiver improvement", pp. 1-30 Dec. 2005.*
Gallager, "Low-Density Parity-Check Codes", IRE Transactions on Information Theory, vol. 7, Jan. 1962, pp. 21-28.
Ryan and Vasic /"An Introduction to LDPC Codes", GlobCom 2003, San Francisco, California, Dec. 5, 2003.
Worthen and Stark, "Unified Design of Iterative Receivers using Factors Graphs", IEEE Transactions on Information Theory(47:2), Feb. 2001, pp. 843-849.
Richardson and Urbanke, "An Introduction to the analysis of Itertive Coding Systems", Proceedings of the 1999 Institute for Mathematics and its Applications (IMA) Summer Program: Codes, Systems and Graphical Models, Minneapolis, Minnesota, Aug. 2-6, 1999.
Pottie and Taylor, "Multilevel Codes Based on Partitioning", IEEE Transactions onInformation Theory (35:1), Jan. 1989 pp. 87-98.
Hideki, et al., "A New Multilevel Coding Method Using Error-Correcting Codes", IEEE Transactions on Information Theory, vol. IT-23, No. 3, 1977.
A.R. Calderbank, "Multilevel Codes and Multistage Decoding",IEEE Transactions on Communications, vol. 37, No. 3 Mar. 1989.

(Continued)

*Primary Examiner*—Juan A Torres
(74) *Attorney, Agent, or Firm*—D. Kligler I.P. Services Ltd.

(57) ABSTRACT

A method for communication includes receiving over a communication link data that has been encoded using a forward error correcting (FEC) code. The encoded data is decoded using an iterative decoding process, which produces metrics. A condition of the communication link is assessed responsively to the metrics.

55 Claims, 3 Drawing Sheets

OTHER PUBLICATIONS

Huaning Niu, et al., Iterative Channel Estimation and LDPC Decoding over Flatfading Channels: A Factor Graph Approach, 2003 Conference on Information Sciences and Systems, The Johns Hopkins University, Mar. 12-14, 2003.

Xiaowei Jin, et al., "Analysis of Joint Channel Estimation and LDPC Decoding on Block Fading Channels", International Symposiumon Information Theory and its Applications, ISITA2004, Parma, Italy, Oct. 10-13, 2004.

Dr. Lin-Nan Lee, "LDPC Codes, Application to Next Generation Communication Systems", Hughes Network System, Oct. 8, 2003.

F.R. Kschischang Capacity Approcing Codes , Iterative Decoding Algorithms and Their Application: Codes Defined on Graphs IEEE Communications Magazine Aug. 2003 pp. 118-125.

Richardson and Urbanke "Capacity Approcing Codes , Iterative Decoding Algorithms and Their Application: The Renaissance of Gallager's Low-Density Parity-Check Codes"IEEE Comunications Magazine Aug. 2003, pp. 126-131.

* cited by examiner

COMMUNICATION LINK CONTROL USING ITERATIVE CODE METRICS

FIELD OF THE INVENTION

The present invention relates generally to communication systems, and particularly to methods and systems for adaptive control of communication link operational modes.

BACKGROUND OF THE INVENTION

Low density parity check (LDPC) codes are a class of forward error correcting (FEC) codes, first introduced by Gallager in "Low-Density Parity-Check Codes," IRE Transactions on Information Theory, Volume 7, January, 1962, pages 21-28, which is incorporated herein by reference. LDPC codes are also described by Ryan and Vasic in "An Introduction to LDPC Codes," GlobeCom 2003, San Francisco, Calif., Dec. 5, 2003, which is incorporated herein by reference.

LDPC codes, as well as other code classes such as turbo codes, are often decoded using iterative decoding processes. Iterative decoding methods are described, for example, by Worthen and Stark in "Unified Design of Iterative Receivers using Factor Graphs," IEEE Transactions on Information Theory, (47:2), February, 2001, pages 843-849, and by Richardson and Urbanke in "An Introduction to the Analysis of Iterative Coding Systems," Proceedings of the 1999 Institute for Mathematics and its Applications (IMA) Summer program: Codes, Systems and Graphical Models, Minneapolis, Minn., Aug. 2-6, 1999, which are incorporated herein by reference.

SUMMARY OF THE INVENTION

Iterative FEC decoding methods often produce and use metrics of received bits and/or symbols as part of the decoding process. Some metrics are bit-related, such as, for example, likelihood ratios (LRs) and log-likelihood ratios (LLRs) of individual bits in the received symbols. Other metrics may be based on "parity satisfied" indications produced by the decoding process, or on the number of iterations performed by the process.

Embodiments of the present invention provide methods and systems for assessing the condition of a communication link using metrics produced by the iterative FEC decoding process, or functions defined over such metrics.

In some embodiments, an operational mode of the communication link is modified responsively to the assessed condition. Modifying the operational mode may comprise, for example, modifying the transmitter output power level, changing an adaptive coding and modulation (ACM) setting of the link, switching to a backup link in a protected configuration, or a combination of such modifications. Several exemplary link protection configurations using modifications of this sort are described hereinbelow.

Additionally or alternatively, the assessed link condition can be reported to an external user or application, such as a network management system that tracks the status and performance of multiple communication links. Further additionally or alternatively, the assessed link condition can be used for monitoring and collecting statistics regarding the performance of the communication link over time.

Using similar metrics for both FEC decoding and link condition assessment reduces the computational complexity and hardware requirements of the system. In many cases, bit-related metrics provide closer agreement with the true bit error performance of the link in comparison with symbol-related metrics. Thus, basing a decision to modify an operational mode on bit-related metrics can improve the end-to-end error performance of the link. Additionally, the probability of false alarm (i.e., the likelihood of unnecessarily modifying the operational mode) can be reduced.

There is therefore provided, in accordance with an embodiment of the present invention, a method for communication, including:

receiving over a communication link data that has been encoded using a forward error correcting (FEC) code;

decoding the encoded data using an iterative decoding process, which produces metrics; and assessing a condition of the communication link responsively to the metrics.

In an embodiment, the forward error correcting code includes a low density parity check (LDPC) code. Alternatively, the forward error correcting code includes a turbo code.

In another embodiment, receiving the data includes receiving a sequence of symbols, each of the received symbols representing one or more bits of the data, and the metrics include bit-related metrics defined over at least part of the one or more bits in each of the received symbols. In yet another embodiment, the bit-related metrics include at least one of likelihood ratios (LR) and log likelihood ratios (LLR) of the at least part of the one or more bits.

In still another embodiment, the bit-related metrics are defined over only part of the one or more bits in each of the received symbols, in order to reduce a size of a memory used for storing the bit-related metrics.

In an embodiment, assessing the condition of the communication link includes evaluating a statistical function of the metrics.

In another embodiment, assessing the condition of the communication link includes tentatively demodulating the data without decoding the FEC to produce tentative demodulation decisions, and evaluating a metric function based on the tentative demodulation decisions.

In yet another embodiment, the metric function depends on differences of the metrics from noise-free values of the metrics that are based on the tentative demodulation decisions.

In still another embodiment, assessing the condition of the communication link includes assessing the condition based on a number of iterations performed by the iterative decoding process.

In an embodiment, assessing the condition of the communication link includes evaluating a metric function based on the decoded data produced by the iterative decoding process. The metric function may depend on a Hamming distance between the decoded data and between an estimate of the data based on tentative decisions produced without decoding the FEC. Additionally or alternatively, the metric function depends on a soft distance between log-likelihood ratios (LLRs) produced prior to decoding the FEC and between respective noise-free values of the LLRs based on the decoded data.

In another embodiment, the method includes reducing a resolution in a quantization of the metrics so as to reduce a size of a memory used for storing the metrics.

In yet another embodiment, the metrics include an indication produced by the iterative decoding process upon successfully decoding a block of the data. In an embodiment, the indication includes a sequence of indications produced responsively to a respective sequence of blocks of the data, and assessing the condition of the communication link includes estimating an error rate of the communication link responsively to the indications. Assessing the condition of the communication link may include assessing a lock status of the communication link responsively to the indication. Additionally or alternatively, assessing the condition of the communication link includes measuring a number of unsuccessfully decoded blocks of the data in which the indications are not produced. In an embodiment, the method includes stopping the iterative decoding process responsively to the indication.

In an embodiment, the method includes modifying an operational mode of the communication link responsively to the assessed condition. Modifying the operational mode may include modifying an output power level of a transmitter transmitting the data. In another embodiment, the communication link uses adaptive coding and modulation (ACM), and modifying the operational mode includes modifying an ACM setting of the communication link by modifying at least one of a code rate of the FEC and a signal constellation used to modulate the data.

Additionally or alternatively, the communication link includes a main communication link and a backup communication link, and modifying the operational mode includes switching from the main communication link to the backup communication link.

In yet another embodiment, the backup communication link is inactive before switching from the main to the backup communication link, and switching from the main to the backup communication link includes initiating data transmission over the backup communication link. Alternatively, the data is transmitted over both the main and backup communication links, and switching from the main to the backup communication link includes choosing to read a block of the data from the backup communication link.

In still another embodiment, the communication link includes two or more main communication links and a backup communication link, and modifying the operational mode includes selecting one of the two or more main communication links to be protected by the backup communication link.

In an embodiment, the method includes reporting the assessed condition to an external application so as to enable at least one of performance monitoring of the communication link and status monitoring of a plurality of communication links that includes the communication link.

There is additionally provided, in accordance with an embodiment of the present invention, a communication receiver, including:

a front end, which is arranged to receive over a communication link data that has been encoded using a forward error correcting (FEC) code;

a metric calculation module, which is arranged to calculate metrics responsively to the received data;

a decoder, which is arranged to decode the encoded data using an iterative decoding process using the metrics; and a controller, which is arranged to assess a condition of the communication link responsively to the metrics.

There is further provided, in accordance with an embodiment of the present invention, a communication system, including:

a transmitter, which is arranged to encode data using a forward error correcting (FEC) code and to transmit the data over a communication channel; and a receiver, which is arranged to receive the data, to calculate metrics responsively to the received data, to decode the encoded data using an iterative decoding process using the metrics, and to assess a condition of the system responsively to the metrics.

The present invention will be more fully understood from the following detailed description of the embodiments thereof, taken together with the drawings in which:

DETAILED DESCRIPTION OF EMBODIMENTS

Figure 1:
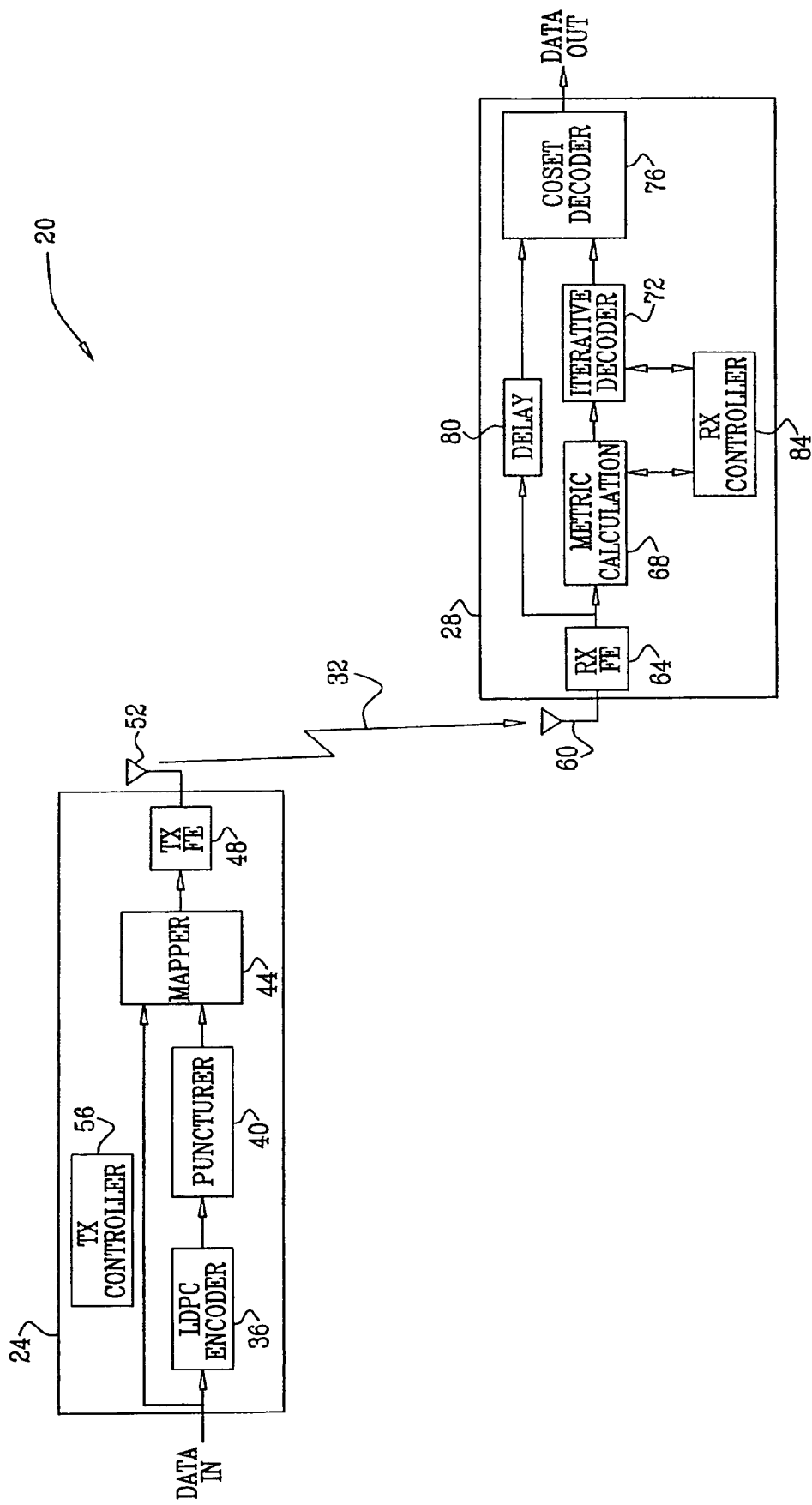
FIG. 1 is a block diagram that schematically illustrates a communication system, in accordance with an embodiment of the present invention.

FIG. 1 is a block diagram that schematically illustrates a communication system 20, in accordance with an embodiment of the present invention. System 20 transmits data from a transmitter 24 to a receiver 28 over a communication channel 32. The transmitter, receiver and channel are collectively referred to herein as a communication link. System 20 may comprise a wireless communication system, such as a microwave point-to-point link, a cellular link or any other suitable wireless link. Alternatively, system 20 may comprise a wireline system, such as a cable communication system.

Transmitter 24 encodes the data using a forward error correcting (FEC) code to improve the error performance of the link. The transmitter uses a code, which is subsequently decoded at the receiver by an iterative decoding process, as will be explained below. In the exemplary embodiment of FIG. 1, transmitter 24 uses an LDPC code, although other forward error correcting codes that can be decoded using iterative processes, such as turbo codes, can also be used.

An LDPC encoder 36 accepts the input data and produces LDPC code words. The LDPC code words comprise data bits and parity bits, which are also referred to as redundancy bits. The parity bits are used for correcting errors, as is known in the art. Each LDPC code word comprises a binary word, typically several thousand bits long. Any suitable LDPC encoder can be used for encoding the data. In some embodiments, a puncturer 40 may be used to reduce the number of parity bits, in order to increase the code rate of the system (i.e., reduce the amount of redundancy).

Figure 2:
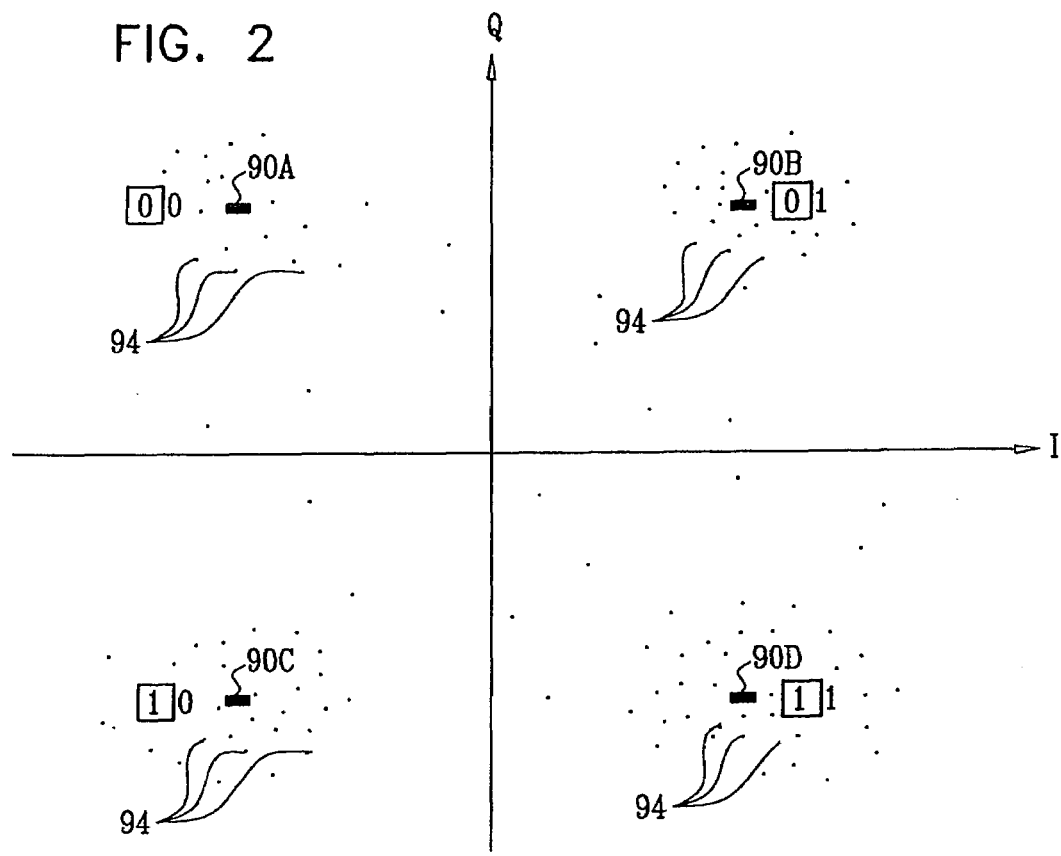
FIG. 2 is a signal space diagram that schematically illustrates received symbols, in accordance with an embodiment of the present invention.

The bits of the LDPC code words are modulated, i.e., mapped to transmitted symbols, by a constellation mapper 44. Generally, system 20 uses a modulation scheme, such as binary phase shift keying (BPSK), quaternary phase shift keying (QPSK), quadrature amplitude modulation (QAM) or any other suitable modulation. In accordance with the modulation scheme used, mapper 44 maps bits, or groups of bits, to symbols selected from a predetermined signal constellation. For example, when system 20 uses QPSK, the signal constellation comprises four constellation symbols, and mapper 44 maps every two bits to a transmitted symbol. In 16-QAM, the constellation comprises sixteen constellation symbols, and mapper 44 maps every four bits to a transmitted symbol. FIG. 2 below shows an exemplary QPSK signal constellation and corresponding bit mapping.

In some embodiments, only some of the bits in the LDPC code word are encoded by encoder 36, and the remaining bits are left uncoded. As can be seen in the figure, mapper 44 may accept a combination of coded and uncoded bits and map them to transmitted symbols.

The baseband symbols produced by mapper 44 are provided to a transmitter front end (TX FE) 48, which performs functions such as pulse shaping, digital-to-analog (D/A) conversion, filtering, upconversion to a suitable radio frequency, power amplification and power control. The transmitter front end produces a modulated radio signal, which is transmitted via a transmit antenna 52 over channel 32. A transmitter controller 56 manages and controls the operation of transmitter 24.

In some embodiments, system 20 uses adaptive coding and modulation (ACM). In ACM, the code rate of the FEC and the signal constellation are jointly selected, to match the channel conditions, desired data rate and/or quality of service. Typically, two or more combinations of code rate and signal constellation are predefined. The transmitter selects a suitable combination, often based on reception quality measurements performed at the receiver. Each combination of code rate and signal constellation is referred to as an ACM setting.

The radio signal transmitted by transmitter 24 is received at receiver 28 by a receive antenna 60 and provided to a receiver front end (RX FE) 64. The receiver front end performs functions such as down conversion to a suitable intermediate frequency (IF) or to baseband, filtering, analog to digital (A/D) conversion, gain control, matched filtering, equalization, carrier recovery and synchronization. RX FE 64 produces received symbols, typically expressed as a stream of complex digital samples. The received symbols represent the symbols transmitted by the transmitter, and in addition typically comprise noise and/or distortion components. In general, noise and distortion may be introduced by the transmitter, channel and/or receiver. The received symbols are also referred to as soft symbols, i.e., symbols that may contain noise and distortion and are not yet associated with a particular constellation symbol.

Receiver 28 comprises a metric calculation module 68 and an iterative decoder 72, which jointly decode the LDPC-encoded data carried by the received symbols. Any suitable iterative decoding process can be used for this purpose. Several exemplary methods and receiver configurations are described in the above-cited references. In principle, metric calculation module 68 accepts the received soft symbols, which can be viewed as points in the In-phase/Quadrature (I/Q) plane. For each received soft symbol, module 68 produces bit-related metrics, which estimate likelihoods that a given coded bit in the corresponding transmitted symbol was "1" or "0". It is important to note that the metrics calculated by module 68 are bit-related and not symbol-related. Each metric is associated with a particular bit of the symbol, and not with the signal-space symbol as a whole. The concept of bit-related metrics is demonstrated in the description of FIG. 2 below.

In some embodiments, module 68 also produces tentative decisions based on the received symbols. For each received symbol, module 68 selects a constellation symbol out of the currently-used signal constellation, which was most likely transmitted by the transmitter. For example, module 68 may determine the constellation symbol having the smallest Euclidean distance in the I/Q plane from the received symbol. The decisions made by module 68 are referred to as tentative decisions since they do not take into account the improved reliability that can be obtained from the FEC. In some embodiments, the tentative decisions themselves may be based on the metrics calculated by module 68. It should be noted that when the received symbols are based on both coded and uncoded bits, module 68 should be notified or otherwise be aware of the values of the uncoded bits in order to produce tentative symbol decisions.

Iterative decoder 72 performs an iterative decoding process that uses the bit-related metrics. The iterative decoding process typically begins with a set of initial bit-related metrics (e.g., LLRs), and attempts to converge to a valid LDPC code word that best matches the bit-related metrics.

In some embodiments, decoder 72 produces an indication that a matching code word is found by the iterative decoding process. This indication is referred to as "parity satisfied," since it indicates that all parity checks made by the decoder were satisfied for the output code word. Otherwise (e.g., when the iterative decoding process failed to converge to a code word within a predetermined number of iterations), the decoder typically outputs the code word that contains the minimum number of unsatisfied parity checks, which usually means the minimum number of uncorrected errors. In some embodiments, decoder 72 outputs the number of iterations performed in order to reach the matching code word. The number of iterations and the "parity satisfied" indications are also referred to herein as metrics.

Typically, decoder 72 stops the iterative decoding process when a matching code word is found, even when a predetermined number of iterations is defined. Stopping the iterative process as soon as a match is found helps to reduce the power consumption of the receiver. A receiver controller 84 manages and controls the operation of receiver 28.

As noted above, some of the data bits may be transmitted without encoding. In these embodiments, receiver 28 comprises a delay line 80, which delays the uncoded bits. A coset decoder 76, as is known in the art, accepts the coded and uncoded bits and provides reliable estimates of the uncoded bits. Techniques that use combinations of coded and uncoded bits and other multilevel coding methods are described, for example, in U.S. Patent Application Publication 2005/0010853 A1, whose disclosure is incorporated herein by reference. Coset codes are also described by Pottie and Taylor in "Multilevel Codes Based on Partitioning," IEEE Transactions on Information Theory (35:1), January, 1989, pages 87-98, which is incorporated herein by reference.

The output of coset decoder 76 is provided as the output data of receiver 28. In embodiments in which all bits are encoded, the decoded LDPC code words produced by decoder 72 are provided as output data of the receiver. In these embodiments, delay line 80 and coset decoder 76 are omitted.

Metrics and metric functions may be produced before, during and/or at the end of the iterative decoding process. Some of the metrics described above, such as LLRs, are typically produced before and/or during the iterative decoding process. Other metrics, such as "parity satisfied" indications and the number of iterations, are produced at the end of the iterative process.

The methods and systems described herein use the metrics produced by module 68 and/or iterative decoder 72 in order to assess the condition of the communication link and, if necessary, modify its mode of operation. In the context of the present patent application and in the claims, modifying an operational mode of the communication link means modifying any operating characteristic of the transmitter, receiver, or both.

As will be described and demonstrated below, receiver controller 84 in receiver 28 uses the metrics to control operational modes such as switching to a backup link, switching to a different ACM setting and changing the power level of the transmitter. The mode of operation may be modified, for example, when the attenuation of channel 32 increases or when a failure or performance degradation occurs in transmitter 24 or receiver 28.

Typically, the assessment of the link condition uses metrics that are calculated inherently as part of the iterative decoding process of the FEC. Using similar metrics for both FEC decoding and link assessment reduces the computational complexity and hardware requirements of the system. In many cases, basing the link assessment on bit-related rather than symbol-related metrics provides closer agreement with the true bit error performance of the link. As a result, bit error degradation can be reliably detected and corrected by changing the mode of operation, improving the end-to-end error performance of the link. Additionally, the probability of false alarm (i.e., unnecessarily changing the operational mode) can be reduced.

FIG. 2 is a signal space diagram that schematically illustrates received symbols, shown to demonstrate the concept of using bit-related metrics, in accordance with an embodiment of the present invention. In the example of FIG. 2, system 20 uses QPSK modulation, i.e., 2 bits per symbol. Four QPSK constellation symbols denoted 90A . . . 90D are plotted at their respective I/Q coordinates. Constellation symbols 90A . . . 90D correspond to the bit pairs {0,0}, {0, 1}, {1, 0} and {1, 1}, respectively. Multiple received symbols 94 are plotted as signal points, in accordance with their I/Q coordinates. As can be seen in the figure, many of the signal points fall in the vicinity of constellation symbols 90A . . . 90D. Other signal points, typically having higher noise and distortion content, fall further away from the constellation symbols.

Each received symbol 94 corresponds to two transmitted bits, which transmitter 24 modulated to produce a corresponding transmitted symbol. In some embodiments, the bit-related metric produced by module 68 comprise likelihood ratios (LR) of the bits of the received symbols or estimations thereof. The LR of a bit x is defined as $$LR = \frac{Pr(x=1 \mid y)}{Pr(x=0 \mid y)} \quad [1]$$

wherein x denotes a given bit of the transmitted symbol and y denotes the received symbol signal point in signal space. For example, the LR of the first bit equals the probability that, given a received symbol y, the first bit of the transmitted symbol that produced received symbol y was "1", divided by the probability that this bit was "0". When all bits are coded, for M bits per symbol modulation, M LRs can be calculated, one LR for each bit in the symbol. In the example of FIG. 2, the LR of the first bit in the symbol is given by $$LR = \frac{Pr(\text{transmitted\_symbol}= \{1, 0\} \cup \{1, 1\} \mid y)}{Pr(\text{transmitted\_symbol}= \{0, 0\} \cup \{0, 1\} \mid y)} \quad [2]$$

In other words, the LR of the first bit equals the probability that, given a received symbol y, the transmitted symbol that produced received symbol y was either 90C or 90D, divided by the probability that the transmitted symbol was either 90A or 90B. Module 68 can estimate the LR value based, for example, on the Euclidean distances of the received symbol in question from the different constellation symbols.

As another example, which also demonstrates the use of coded and uncoded bits, consider a system that uses 128-QAM, i.e., a signal constellation of 128 symbols. Each symbol represents a total of seven bits, out of which four bits are coded and three are uncoded. In this case, module 68 calculates four different LRs for each received symbol. To calculate the LR of the first bit, module 68 estimates the probability that, given the particular received symbol (I/Q) signal point, the first bit in the transmitted symbol was "1" and the probability that the bit was "0". Taking the ratio of these two probabilities produces the LR. The LRs of the other three bits in the symbol are calculated in a similar manner. In the description above, LRs are calculated only for the coded bits. In alternative embodiments, LRs of uncoded bits may also be calculated and used.

Alternatively, module 68 may calculate log-likelihood ratios (LLRs) of the bits of the received symbol. The LLR metric is defined as $$LLR = \log\left[\frac{Pr(x=1 \mid y)}{Pr(x=0 \mid y)}\right] = \log[LR]. \quad [3]$$

Receiver controller 84 in receiver 28 uses the bit-related metrics produced by module 68 to assess the link condition. The receiver controller may use LRs, LLRs, or any other suitable bit-related metric for assessing the link condition. Alternatively, controller 84 may assess the link condition by evaluating a metric function defined over the LRs and/or LLRs. In some embodiments, only a subset of the LRs or LLRs is used, even though the iterative FEC decoding process may use all of them. For example, the link condition assessment can be based on only LRs or LLRs corresponding to a particular bit or subset of bits in the symbol, or on a metric function defined over the subset. The metric functions described below refer to LLRs for clarity of explanation. These functions, however, can be similarly defined using LRs or using combinations of LRs and LLRs. (As noted above, controller 84 may also use metrics produced by iterative decoder 72. The use of such metrics is described further below.)

Defining a metric function over the LLRs may comprise defining a range of valid LLRs and considering only LLR values within the range. The function may comprise, for example, statistical functions such as the variance or mean of the LLR value over a particular code word or set of code words. A larger LLR variance, for example, may indicate a poorer link condition, and vice versa. The variance or mean of the absolute value of the LLR can also sometimes be used as a metric function.

An alternative metric function may be based on the differences (i.e., soft distances) of the LLR values from an approximated noise-free LLR value. The noise-free LLR value is defined as the LLR value assuming perfect reception of the transmitted symbols without noise or distortion, i.e., when all received symbols fall exactly on the correct constellation symbols.

In the absence of noise and distortion, the LLR can take a value of either infinity ($\infty$) or minus infinity ($-\infty$), depending on whether "1" or "0" was transmitted, respectively. In receiver 28, $\infty$ and $-\infty$ are respectively approximated by the largest positive and smallest negative values, in accordance with the number representation convention used in the receiver. Thus, a metric function may be based on the differences between the LLR values and the smallest or largest representable number, whichever is nearer. For example, the function may comprise a sum of squares of the distances from the approximated noise-free LLR. Since these functions depend on the noise-free LLR value, they typically depend on the tentative decisions made by module 68.

The metric functions described above depend only on the outputs of metric calculation module 68. Alternatively, the receiver controller may use metric functions that also depend on the outputs of iterative decoder 72, i.e., on the decoded bits of the LDPC code words. In general, metric functions that depend only on the outputs of module 68 have smaller latency and enable a shorter response time in modifying the operational mode of the system. On the other hand, metric functions depending on the decoded code words tend to be more accurate, since the output of decoder 72 contains fewer errors in comparison to the tentative decisions of module 68.

When receiver controller 84 calculates any metric function that depends on the constellation symbols, it can refer to the decoded bits produced by decoder 72 rather than to the tentative decisions made by module 68. For example, controller 84 may calculate a function based on the differences of the LLR values from the estimated noise-free LLR. In the present example, however, the noise-free LLR considers the decoded bits produced by decoder 72.

Yet another metric function may depend on the differences between the decoded bits produced by iterative decoder 72 and the tentative decisions made by module 68. For example, controller 84 may calculate the Hamming distance between the decoded bits and the tentative decisions. A large Hamming distance indicates a large number of bits that were corrected by the FEC, which is indicative of a poorer link condition. The Hamming distance can be averaged over a number of code words to improve the accuracy of the metric function.

As another example, controller 84 may estimate the transmitted symbols using tentative decisions, and derive the bits that correspond to these estimated symbols. The Hamming distance between these bits and the decoded bits produced by decoder 72 can also be used as a metric function. The Hamming distance can be averaged over a number of code words.

Further alternatively, controller 84 may calculate a metric function based on the Euclidean distances between the received symbols and between the symbols represented by the decoded bits.

In some embodiments, only some of the bits in the LDPC code word are used in evaluating the metric function. Using only some of the bits can reduce the memory required by controller 84, since the LLR values are typically cached in memory until the corresponding decoded bits are produced by decoder 72. Additionally or alternatively, the memory used by controller 84 can be reduced by representing the LLR values and/or the values of the metric function with a reduced quantization resolution.

In some embodiments, metrics produced by the iterative decoding process can be used in the stages of setting up the link, such as during initial acquisition. For example, as noted above, in some embodiments decoder 72 produces a "parity satisfied" indication when all parity checks made by the decoder are satisfied for the output code word. In these embodiments, the "parity satisfied" indication can be used as a metric, which is indicative of the link condition. For example, a high percentage of "parity satisfied" indications over a sequence of code words may be used as an indication that the communication link is locked successfully. If the link is not locked, such as when the frequency offset between transmitter 24 and receiver 28 is too high, the receiver is not able to demodulate and decode the transmitted symbols correctly, and decoder 72 does not produce "parity satisfied" indications.

Thus, receiver controller 84 may comprise suitable circuitry, such as counters, state machines and/or other logic, which accepts "parity satisfied" indications of multiple code words from decoder 72, and outputs a lock indication of the link. A similar mechanism can also be implemented in software, or as a combination of hardware and software elements.

Metrics based on "parity satisfied" indications can also be used during normal operation of the link. For example, collecting "parity satisfied" indications from a sequence of code words can be used to estimate the actual error rate of the link. For example, controller 84 can estimate the packet error rate (PER), i.e., the fraction of code words containing errors, by counting the fraction of code words for which no "parity satisfied" indication is accepted from decoder 72. The PER estimate can be translated to a bit error rate (BER) estimate by multiplying the PER estimate by the ratio between the average number of errors per code word and the number of bits in the code word. Controller 84 may use stored previously-stored values or statistics of the average number of errors per code word, such as values measured or simulated during system design.

Alternatively, the total number of unsatisfied parity checks in a sequence of code words can be counted. The BER can be estimated by calculating the average number of unsatisfied parity checks per code word and multiplying this value by the average number of erroneous bits per unsatisfied parity check. Controller 84 may use previously-stored values or statistics of the average number of unsatisfied parity checks per code word and of the average number of erroneous bits per unsatisfied parity check.

Additionally or alternatively, the metric function may take into account the number of iterations performed by iterative decoder 72 until a matching code word is found (i.e., until "parity satisfied" indication is produced).

Figure 3:
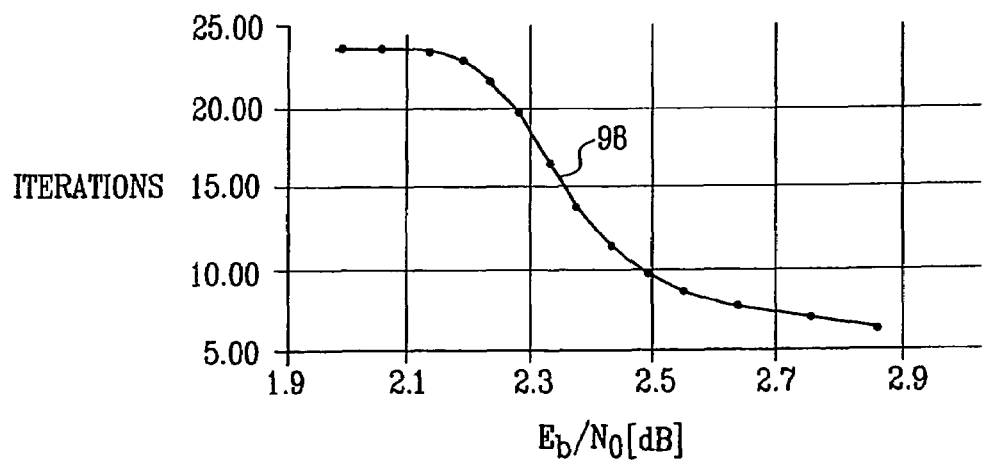
FIG. 3 is a graph showing simulated performance of an iterative LDPC decoder, in accordance with an embodiment of the present invention.

FIG. 3 is a graph showing simulated performance of an iterative LDPC decoder, in accordance with an embodiment of the present invention. A curve 98 shows the number of iterations performed by the iterative decoder as a function of the ratio of bit energy to noise density ($E_b/N_0$). The simulated system configuration uses QPSK modulation, and a rate 0.75 LDPC code having 16128 bit words. As can be seen in the figure, the number of iterations is highly correlated with $E_b/N_0$, and can thus be used as an indication of the link condition.

The different metrics and metric functions described above provide a quantitative indication of the link condition. Based on these metrics, receiver controller 84 determines whether it is desirable to modify the operational mode of the link. The controller may compare the metric value to a predetermined threshold or apply any other suitable logic to the metric value in order determine whether to initiate a mode modification. The mode modification itself may involve the receiver, transmitter, or both.

For example, in some embodiments modifying the operational mode of the link comprises changing the output power level of transmitter 24. In these embodiments, receiver controller 84 requests TX FE 48 to modify the output power of the transmitter, based on the metric value. Typically, receiver controller 84 transmits the request to transmitter controller 56 via a management communication link (not shown). Such modification of the transmitter power level may be performed, for example, when the attenuation of channel 32 changes, when the level of interference present at the receiver changes, or when the sensitivity of the receiver is degraded because of hardware failure or other reason. The receiver controller may request that the transmitter power be increased or decreased, as indicated by the metric.

As another example, modifying the operational mode of the link may comprise selecting a different ACM setting. In this example, receiver controller 84 senses that the currently-used ACM setting is not compatible with the current link condition. Receiver controller 84 selects the appropriate setting to be used under the newly-assessed link condition. The receiver controller sets the new ACM setting in the receiver and also requests transmitter controller 56 to change the ACM setting of the transmitter accordingly.

In some embodiments, a main communication link is protected by a backup link. In these embodiments, modifying the operational mode of the link may comprise switching from the main link to the backup link, as described below.

Figure 4:
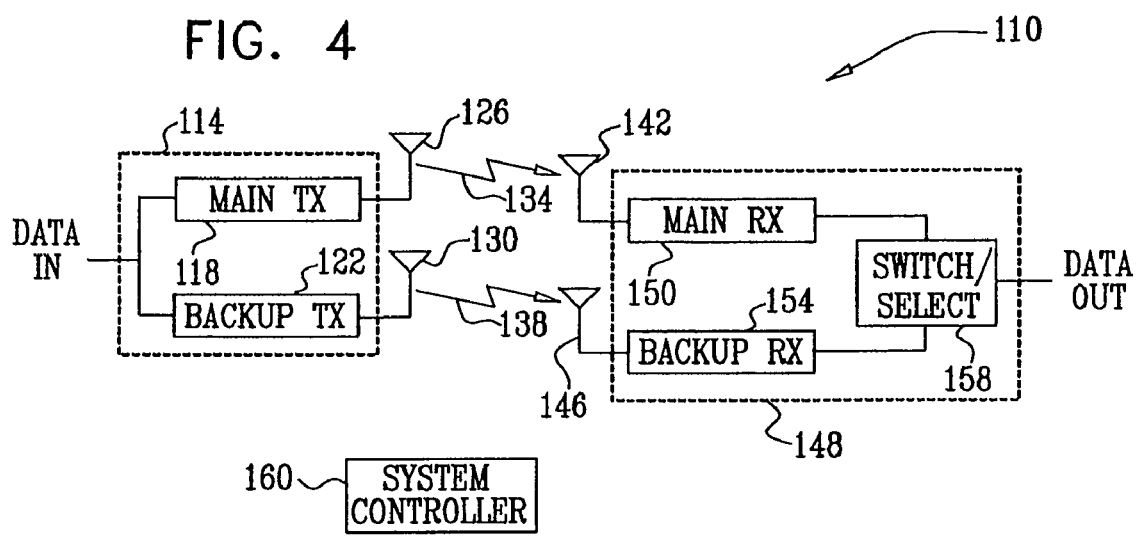
FIG. 4 is a block diagram that schematically illustrates a communication system with link protection, in accordance with an embodiment of the present invention.

FIG. 4 is a block diagram that schematically illustrates a communication system 110 with link protection, in accordance with an embodiment of the present invention. System 110 comprises a protected transmitter 114, which comprises a main transmitter 118 and a backup transmitter 122. Transmitters 118 and 122 are similar in structure and functionality to transmitter 24 of FIG. 1 above. The main and backup transmitters transmit radio signals via a main transmit antenna 126 and a backup transmit antenna 130, respectively.

The signals transmitted by the main and backup transmitters respectively pass through channels 134 and 138 and are respectively received by a main receive antenna 142 and a backup receive antenna 146. The signals are provided to a protected receiver 148, which respectively comprises a main receiver 150 and a backup receiver 154. Receivers 150 and 154 are similar in structure and functionality to receiver 28 of FIG. 1 above. Transmitter 118, antenna 126, channel 134, antenna 142 and receiver 150 are referred to as a main link. The main link is protected by a backup link, which comprises transmitter 122, antenna 130, channel 138, antenna 146 and receiver 154.

The protected receiver comprises a switching/selection module 158, which selects data from one of the main and backup links and provides it as output data. A system controller 160, which may be located in transmitter 114, in receiver 148 or in any other suitable location, manages and controls the operation of system 110, and in particular controls module 158.

In the configuration of FIG. 4, the same data is transmitted over the main and backup links. Controller 160 selects whether to use the data of the main or backup link and controls module 158 accordingly. When the data is partitioned into blocks, the selection is typically made on a block-by-block basis.

In some embodiments, each LDPC code word is defined as a data block for this purpose, and "parity satisfied" indications produced for LDPC code words are used as selection criteria between the main and backup links. The main and backup receivers monitor the "parity satisfied" indications of LDPC code words produced by their iterative decoders, as described above. For each LDPC code word (which is decoded simultaneously by the two receivers), if a "parity satisfied" indication is produced by the main receiver, controller 160 controls module 158 to select the respective block of data provided by the main receiver as the output data. If "parity satisfied" indication is produced by the backup receiver and not by the main receiver, controller 160 controls module 158 to select the block of data provided by the backup receiver.

The embodiment of FIG. 4 is an exemplary system configuration, chosen purely for the sake of conceptual clarity.

Any other suitable configuration can be used to switch between a main link and a backup link based on the metrics and/or metric functions described above.

For example, in an alternative embodiment, the main and backup links comprise separate transmitters, antennas and receivers. Nominally, data is transmitted only over the main link and the backup link is inactive. The receiver of the main link monitors the condition of the link using the metrics or metric functions, as described above. If the receiver of the main link determines that the link conditions are unacceptable, the system controller activates the backup link. From this point, data is transferred over the backup link. The system controller may decide to revert back to the main link if its conditions improve. Alternatively, the controller may switch the roles of the main and backup links, so that the newly-activated backup link becomes the main link, and vice versa.

Further alternatively, the main and backup links may have separate transmitters and share the same receiver, or have separate receivers and share the same transmitter.

In some embodiments, two or more main links can be protected by a single backup link, in a configuration often referred to as 1:N protection. In these embodiments, a system controller uses metrics or metric functions produced by the iterative decoders of the main links to determine which of the main links should be protected by the backup link. Having selected the main link to be protected, any suitable protection method or configuration can be used, such as the configurations described above.

Figure 5:
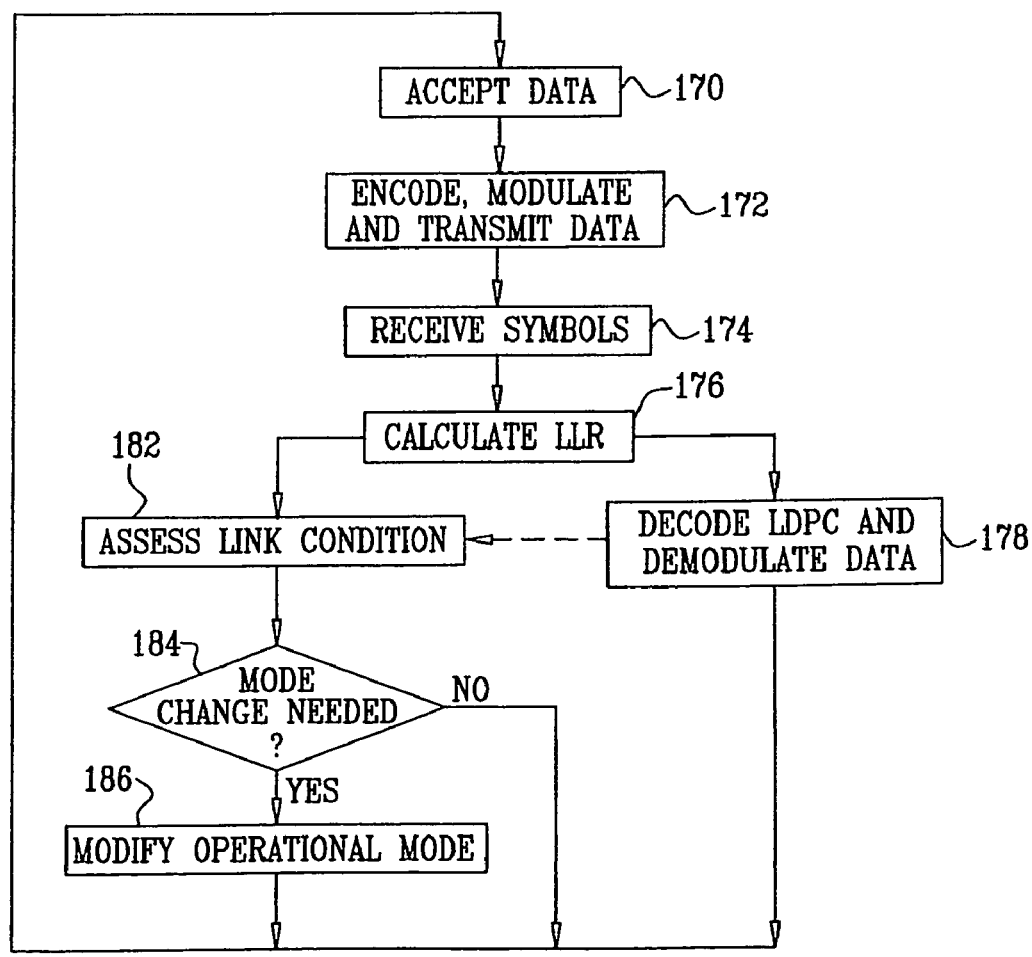
FIG. 5 is a flow chart that schematically illustrates a method for controlling an operational mode of a communication system, in accordance with an embodiment of the present invention.

FIG. 5 is a flow chart that schematically illustrates a method for controlling an operational mode of a communication system, in accordance with an embodiment of the present invention. The method description refers to system 20 of FIG. 1 above, but can similarly be used with other system configurations, such as the configuration of FIG. 4 above.

The method begins with transmitter 24 accepting input data to be transmitted to receiver 28, at a data input step 170. The transmitter encodes, modulates and transmits the data, at a transmission step 172. In particular, the transmitter encodes the data using an LDPC code. As noted above, any other code that may be decoded using an iterative process, such as a turbo code, can also be used.

Receiver 28 receives the transmitted signal, at a reception step 174. The receiver front end produces received symbols, which typically contain noise and distortion content. Module 68 of receiver 28 calculates the LLRs of the received symbols, at an LLR calculation step 176. Iterative decoder 72 decodes the LDPC-encoded data using the LLRs, at a decoding step 178. The decoder produces the decoded LDPC code words as output data (or provides them to coset decoder 76, which produces the output data based on the code words and the uncoded bits). The method loops back to data input step 170 above, to continue accepting data at transmitter 24.

Receiver controller 84 of receiver 28 uses the LLRs produces at step 176 above to assess the condition of the link, at a link assessment step 182. The receiver controller can use any suitable metric or metric function, such as the functions described above. In some embodiments, the metric function takes into account the decoded LDPC code words produced by decoder 72 at step 178 above.

Receiver controller 84 checks whether an operational mode modification is desired, based on the assessed link condition, at a checking step 184. If a mode change is desired, controller 84 initiates a mode modification, at a mode modification step 186. Otherwise, step 186 is bypassed and the method loops back to data input step 170 above.

In some embodiments, two or more operational modes may be modified, such as jointly modifying the ACM setting and the transmitter power level. Different operational modes can be modified based on the same metrics or using different metrics for different modes.

Although the embodiments described herein mainly address using the assessed link condition for modifying the operational modes of a communication link, the assessed link condition can be used for additional purposes. For example, the assessed link condition can be reported to an external user or application, such as a network management system that tracks the status and performance of multiple communication links. Further additionally or alternatively, the assessed link condition can be used for monitoring and collecting statistics regarding the performance of the communication link over time.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for communication, comprising:
receiving code words of a Forward Error Correcting (FEC) code that convey data over a communication link from a transmitter to a receiver, each code word comprising multiple symbols, each symbol comprising one or more data bits that have been encoded using the FEC code;
decoding the code words at the receiver using an iterative decoding process, which produces respective decoding metrics of the data bits and recovers the data from the code words using the decoding metrics;
computing a single link quality metric function value for at least one of the code words by processing the respective decoding metrics of the data bits comprised in the multiple symbols that are comprised in the at least one of the code words; and
assessing a condition of the communication link responsively to the single link quality metric function value.

2. The method according to claim 1, wherein the forward error correcting code comprises a low density parity check (LDPC) code.

3. The method according to claim 1, wherein the forward error correcting code comprises a turbo code.

4. The method according to claim 1, wherein the decoding metrics comprise at least one metric type selected from a group of types consisting of likelihood ratios (LR) and log likelihood ratios (LLR) of at least part of the respective data bits.

5. The method according to claim 1, wherein the decoding metrics are defined over only part of the one or more data bits in each of the received symbols, in order to reduce a size of a memory used for storing the decoding metrics.

6. The method according to claim 1, wherein the single link quality metric function value comprises a statistical function of the decoding metrics.

7. The method according to claim 1, wherein assessing the condition of the communication link comprises tentatively demodulating the data bits without decoding the FEC so as to produce tentative demodulation decisions, and wherein computing the single link quality metric function value comprises evaluating the single link quality metric function value based on the tentative demodulation decisions.

8. The method according to claim 7, wherein the single link quality metric function value depends on differences of the decoding metrics from noise-free values of the decoding metrics that are based on the tentative demodulation decisions.

9. The method according to claim 1, wherein the iterative decoding process performs a number of iterations for decoding at least one of the codewords, and wherein the single link quality metric function value depends on the number of the iterations performed by the iterative decoding process.

10. The method according to claim 1, wherein the single link quality metric function value is based on the decoded code words produced by the iterative decoding process.

11. The method according to claim 10, wherein the decoded code words comprise decoded bits, and wherein the single link quality metric function value depends on a Hamming distance between the decoded bits and between an estimate of the decoded bits based on tentative decisions produced without decoding the at least one of the code words.

12. The method according to claim 10, wherein the single link quality metric function value depends on a soft distance between log-likelihood ratios (LLRs) produced prior to decoding the at least one of the code words and between respective noise-free values of the LLRs based on the decoded at least one of the code words.

13. The method according to claim 1, and comprising reducing a resolution in a quantization of the decoding metrics so as to reduce a size of a memory used for storing the decoding metrics.

14. The method according to claim 1, wherein the single link quality metric function value depends on one or more indications produced by the iterative decoding process upon successfully decoding the at least one of the code words.

15. The method according to claim 14, wherein the indications comprise a sequence of the indications produced responsively to a respective sequence of the code words, and wherein computing the single link quality metric function value comprises estimating an error rate of the communication link responsively to the indications.

16. The method according to claim 14, wherein assessing the condition of the communication link comprises assessing a lock status of the communication link responsively to the indications.

17. The method according to claim 14, wherein computing the single link quality metric function value comprises measuring a number of unsuccessfully decoded code words in which the indications are not produced.

18. The method according to claim 14, and comprising stopping the iterative decoding process responsively to the indications.

19. The method according to claim 1, and comprising modifying an operational mode of the communication link responsively to the assessed condition.

20. The method according to claim 19, wherein modifying the operational mode comprises modifying an output power level of a transmitter transmitting the code words.

21. The method according to claim 19, wherein the communication link uses adaptive coding and modulation (ACM), and wherein modifying the operational mode comprises modifying an ACM setting of the communication link by modifying at least one attribute selected from a group of attributes consisting of a code rate of the FEC and a signal constellation used to modulate the code words.

22. The method according to claim 19, wherein the communication link includes a main communication link and a backup communication link, and wherein modifying the operational mode comprises switching from the main communication link to the backup communication link.

23. The method according to claim 22, wherein the backup communication link is inactive before switching from the main to the backup communication link, and wherein switching from the main to the backup communication link comprises initiating data transmission over the backup communication link.

24. The method according to claim 22, wherein the code words are transmitted over both the main and backup communication links, and wherein switching from the main to the backup communication link comprises choosing to read one or more of the code words from the backup communication link.

25. The method according to claim 1, wherein the communication link includes two or more main communication links and a backup communication link, and wherein modifying the operational mode comprises selecting one of the two or more main communication links to be protected by the backup communication link.

26. The method according to claim 1, and comprising reporting the assessed condition to an external application so as to enable at least one action selected from a group of actions consisting of performance monitoring of the communication link and status monitoring of a plurality of communication links that includes the communication link.

27. A communication receiver, comprising:
a front end, which is arranged to receive code words of a Forward Error Correcting (FEC) code that convey data over a communication link, each code word comprising multiple symbols, each symbol comprising one or more data bits that have been encoded using the FEC code;
a metric calculation module, which is arranged to calculate respective decoding metrics of the received data bits and to compute a single link quality metric function value for at least one of the code words by processing the respective metrics of the data bits comprised in the multiple symbols that are comprised in the at least one of the code words;
a decoder, which is arranged to decode the code words and recover the data from the code words using an iterative decoding process using the decoding metrics; and
a controller, which is arranged to assess a condition of the communication link responsively to the single link quality metric function value.

28. The receiver according to claim 27, wherein the forward error correcting code comprises a low density parity check (LDPC) code.

29. The receiver according to claim 27, wherein the forward error correcting code comprises a turbo code.

30. The receiver according to claim 27, wherein the decoding metrics comprise at least one metric type selected from a group of types consisting of likelihood ratios (LR) and log likelihood ratios (LLR) of at least part of the respective data bits.

31. The receiver according to claim 27, wherein the decoding metrics are defined over only part of the one or more data bits in each of the received symbols, in order to reduce a size of a memory used for storing the decoding metrics.

32. The receiver according to claim 27, wherein the single link quality metric function value comprises a statistical function of the decoding metrics.

33. The receiver according to claim 27, wherein the metric calculation module is arranged to tentatively demodulate the data bits without decoding the FEC so as to produce tentative demodulation decisions, and to evaluate the single link quality metric function value based on the tentative demodulation decisions.

34. The receiver according to claim 33, wherein the single link quality metric function value depends on differences of the decoding metrics from noise-free values of the decoding metrics that are based on the tentative demodulation decisions.

35. The receiver according to claim 27, wherein the iterative decoding process performs a number of iterations for decoding the at least one of the code words, and wherein the single link quality metric function value depends on the number of the iterations performed by the iterative decoding process.

36. The receiver according to claim 27, wherein the single link quality metric function value is based on the decoded code words produced by the iterative decoding process.

37. The receiver according to claim 36, wherein the decoded code words comprise decoded bits, and wherein the single link quality metric function value depends on a Hamming distance between the decoded bits and between an estimate of the bits based on tentative decisions produced without decoding the at least one of the code words.

38. The receiver according to claim 36, wherein the single link quality metric function value depends on a soft distance between log-likelihood ratios (LLRs) produced prior to decoding the at least one of the code words and between respective noise-free values of the LLRs based on the decoded at least one of the code words.

39. The receiver according to claim 27, wherein the metric calculation module is arranged to reduce a resolution of a quantization of the decoding metrics so as to reduce a size of a memory used for storing the decoding metrics.

40. The receiver according to claim 27, wherein the single link quality metric function value depends on one or more indications produced by the iterative decoding process upon successfully decoding the at least one of the code words.

41. The receiver according to claim 40, wherein the indications comprise a sequence of the indications produced responsively to a respective sequence of the code words, and wherein the controller is arranged to estimate an error rate of the communication link responsively to the indications.

42. The receiver according to claim 40, wherein the controller is arranged to assess a lock status of the communication link responsively to the indications.

43. The receiver according to claim 40, wherein the metric calculation module is arranged to produce the single link quality metric function value by measuring a number of unsuccessfully decoded code words in which the indications are not produced.

44. The receiver according to claim 40, wherein the decoder is arranged to stop the iterative decoding process responsively to the indications.

45. The receiver according to claim 27, wherein the controller is arranged to cause an operational mode of the communication link to be modified responsively to the assessed condition.

46. The receiver according to claim 45, wherein the controller is arranged to cause a modification of an output power level of a transmitter transmitting the codewords.

47. The receiver according to claim 45, wherein the communication link uses adaptive coding and modulation (ACM), and wherein the controller is arranged to cause a modification of an ACM setting of the communication link by causing a modification of at least one attribute selected from a group of attributes consisting of a code rate of the FEC and a signal constellation used to modulate the code words.

48. The receiver according to claim 45, wherein the communication link includes a main communication link and a backup communication link, and wherein the controller is arranged to cause a switch from the main communication link to the backup communication link.

49. The receiver according to claim 48, wherein the backup communication link is inactive before switching from the main to the backup communication link, and wherein the controller is arranged to cause an initiation of data transmission over the backup communication link.

50. The receiver according to claim 48, wherein the code words are transmitted over both the main and backup communication links, and wherein the controller is arranged to select to read one or more of the code words from the backup communication link.

51. The receiver according to claim 27, wherein the communication link includes two or more main communication links and a backup communication link, and wherein the controller is arranged to assess respective conditions of the two or more main communication links and to select one of the two or more main communication links to be protected by the backup communication link responsively to the assessed conditions.

52. The receiver according to claim 27, wherein the controller is arranged to report the assessed condition to an external application so as to enable at least one action selected from a group of actions consisting of performance monitoring of the communication link and status monitoring of a plurality of communication links that includes the communication link.

53. A communication system, comprising:
a transmitter, which is arranged to produce code words of a Forward Error Correcting (FEC) code that convey data, each code word comprising multiple symbols, each symbol comprising one or more data bits that have been encoded using the FEC code, and to transmit the code words over a communication channel; and a receiver, which is arranged to receive the code words, to calculate respective decoding metrics responsively to the received data bits, to decode the code words and recover the data from the code words using an iterative decoding process using the decoding metrics, to compute a single link quality metric function value for at least one of the code words by processing the respective decoding metrics of the data bits comprised in the multiple symbols that are comprised in the at least one of the code words, and to assess a condition of the system responsively to the single link quality metric function value.

54. The system according to claim 53, wherein the forward error correcting code comprises at least one code type selected from a group of types consisting of a low density parity check (LDPC) code and a turbo code.

55. The system according to claim 53, wherein the receiver is further arranged to cause an operational mode of at least one element selected from a group of elements consisting of the transmitter and the receiver to be modified responsively to the assessed condition.

* * * * *